United States Patent
Morikawa

(10) Patent No.: US 6,353,560 B1
(45) Date of Patent: Mar. 5, 2002

(54) SEMICONDUCTOR MEMORY DEVICE

(75) Inventor: Yoshinao Morikawa, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/686,477

(22) Filed: Oct. 10, 2000

(30) Foreign Application Priority Data

Nov. 30, 1999 (JP) ............................................ 11-341466

(51) Int. Cl.$^7$ .............................................. G11C 16/04
(52) U.S. Cl. .............................. 365/189.09; 365/185.2; 365/185.25
(58) Field of Search ........................ 365/189.09, 185.2, 365/185.25

(56) References Cited

U.S. PATENT DOCUMENTS 5,748,536 A * 5/1998 Kwon et al. ............ 365/185.25
6,108,246 A * 8/2000 Umezawa et al. ...... 365/189.09
6,115,290 A * 9/2000 Kwong ................... 365/185.25
6,147,908 A * 11/2000 Abugharbich et al. . 365/185.25

FOREIGN PATENT DOCUMENTS

JP        3-30193        2/1991

* cited by examiner

Primary Examiner—Trong Phan
(74) Attorney, Agent, or Firm—Morrison & Foerster LLP

(57) ABSTRACT

A semiconductor memory device includes: a bit line; a reference voltage generating circuit; a first transistor whose drain or source region is connected to the bit line, a voltage generated in the reference voltage generating circuit being applied to a gate region of the first transistor; and a memory cell connected to the first transistor at least via the bit line, wherein the reference voltage generating circuit includes: a second transistor connected to the first transistor in a source-follower connection; and at least one first element having an electrical resistance for controlling a current flowing the second transistor.

7 Claims, 5 Drawing Sheets

US 6,353,560 B1

SEMICONDUCTOR MEMORY DEVICE

BACKGROUND OF THE INVENTION

1. Filed of the Invention

The present invention to a semiconductor memory device, and more specifically the present invention relates to a semiconductor memory device so configured as to generate a precharge voltage in the case where a precharge method is used for memory cell reading.

2. Description of the Related Art

For a memory cell reading method in semiconductor memory devices such as MROMs (Mask Read Only Memory), precharge methods have been conventionally proposed. An example will be described below in which a MROM is read by a precharge method. According to the precharge method, a bit line is connected to a memory cell transistor, which is either an ON transistor or an OFF transistor, wherein the bit is first charged to a precharge level for a certain period of time (hereinafter, this time is referred to as a precharge period). After the charging is completed, a sense circuit detects the discharge waveform of the bit line and determines whether the memory cell transistor connected to the bit line is an ON transistor or an OFF transistor.

Memory cell transistors are fabricated by, e.g., an ion injection method, and for making them ON transistors or OFF transistors, for example, the following two methods are used:

In one method, the threshold voltages of transistors are changed so as to form ON transistors which turn to the ON state by applying a voltage VI to their gates and OFF transistors which turn to the OFF state by applying the same voltage V1 to their gates. In the other method, the threshold voltage is not changed. OFF transistors are formed by physically forming an electrical isolation between their sources and drains. For ON transistors, transistors in which the current flows between their sources and drains are used.

FIG. 5 shows a connection example between a precharge circuit and a memory cell transistor in a conventional semiconductor memory device 200. According to the semiconductor memory device 200 in FIG. 5, a precharge circuit includes: a reference voltage generating circuit 30 for generating a reference voltage for charging a bit line 11; and a charge transistor N1 formed of an Nch (N-channel) transistor. An inverter INV1 is used in the reference voltage generating circuit 30. The output of the inverter INV1 is applied to the gate of the charge transistor N1 and the drain of the charge transistor N1 is connected to a supply voltage VCC. The source of the charge transistor N1 is connected to the input terminal of the inverter INV1. The reference voltage generating circuit 30 including the inverter INV1 and a charge transistor N1 together form a feed back bias circuit. The reference voltage generated by the feedback bias circuit is determined by controlling the inversion voltage of the inverter INV1.

The drain of the Nch transistor NTR1 is connected via the bit line 11 to the source of the charge transistor N1. The drain of a memory cell transistor M1 is connected to the source of the Nch transistor NTR1. and the source of the memory cell transistor M1 is connected to the drain of the Nch transistor NTR2. A sense circuit 20 is connected to the bit line 11 between the charge transistor N1 and the Nch transistor NTR1.

The case will now be described where the memory cell transistor M1 of such a semiconductor memory device is an OFF transistor (i.e., no current flows between the source and drain even if the gate voltage is in the H (High) level) and the gate voltages input to the respective gates of the Nch transistor NTR1, the memory cell transistor M1, and the Nch transistor NTR2 are all in the H level. If the bit line 11 connected to the source of the charge transistor N1 is initially in the L (Low) level, the L level is input to the input of the inverter INV1 of the reference voltage generating circuit 30. When the input of the inverter INV1 turns to the L level, the output of the inverter INV1 turns to the H level, and then the H level is input to the gate of the charge transistor N1. The supply voltage VCC, which is connected to the drain of the charge transistor N1, is then applied to the bit line 11.

Since the memory transistor M1 is an OFF transistor, no current path to the GND is provided, and the bit line 11 is charged through the charge transistor N1.

When the bit line 11 is charged to a voltage exceeding the inversion voltage of the inverter INV1, the output of the inverter INV1 turns to the L level and the charge transistor N1 turns to the OFF state. The potential of the bit line 11 then decreases through a spontaneous discharge or the like, and when the potential of the bit line 11 becomes lower than the inversion voltage of the inverter INV1, the output of the inverter INV1 turns again to the H level and the N1 transistor turns to the ON state so as to start the charging of the bit line 11.

By repeating such operations, the bit line 11 is stabilized at a predetermined voltage close to the inversion voltage of the inverter INV1, i.e., the precharge voltage.

In the case where the memory cell transistor M1 is an ON transistor, and the respective gates of the Nch transistor NTR1, memory cell transistor N1, and the Nch transistor NTR2 are all in the H level, the bit line 11 is connected to GND via the Nch transistor NTR1, the memory cell transistor M1, and the Nch transistor NTR2.

When the performance of the charge transistor N1 is low (i.e., the ON resistance is high), the voltage of the bit line 11 can be differentiated between the case where the memory cell transistor M1 is an ON transistor and the case where the memory cell transistor M1 is an OFF transistor. The sense circuit 20 reads the voltage of the bit line 11 and determines whether or not the memory cell transistor M1 is an ON transistor or an OFF transistor.

In recent years, however, the size of memory cells has been significantly reduced and thus the performance (i.e., the current driving performance) of memory cell transistor M1 has declined (i.e., the ON resistance has been higher). This causes the difference of the potentials to become small between of the bit line 11 connected to an ON transistor and the bit line 11 connected to an OFF transistor, and therefore, the sense circuit 20 may not be able to read the difference if the current driving performance of the charge transistor N1 is high. On the other hand, if the performance of the charge transistor N1 is low, the time required to charge the bit line 11 to the precharge voltage is extended, which may prevent a faster reading of the memory cells when the parasitic capacitance of the bit line 11 is large.

In order to solve these problems, a semiconductor memory device 300 shown in FIG. 6 has been proposed. Throughout the drawings, like components are denoted by like reference numerals. The semiconductor memory device 300 has the same configuration as the semiconductor memory device 200 in FIG. 5, except that a high performance (i.e., a low ON resistance) Nch charge transistor N2 is connected to the Nch charge transistor N1 and an Nch transistor NTR0 is connected between the Nch charge transistor N2 and the bit line 11. The gate of the Nch charge transistor N2 is connected to the gate of the Nch charge transistor N1, and the drain of the Nch charge transistor N2 is connected to the supply voltage VCC. The source of the Nch charge transistor N2 is connected to the drain of the Nch transistor NTR0 and the source of the Nch transistor NTR0 is connected to the bit line 11.

The Nch transistor NTR0 is turned ON/OFF by signals generated in a circuit generally known as an ATD circuit (address transition detection circuit). The period while the Nch transistor NTR0 is ON corresponds to the precharge period, during which the bit line 11 is charged.

According to the semiconductor memory device 300, the bit line 11 is charged quickly during the precharge period by the Nch charge transistor N2. When the precharge period ends, the Nch transistor NTR0 turns OFF, and no current flows from the Nch charge transistor N2 to the bit line 11. After the completion of the precharge period, the sense circuit 20 reads the bit line 11 in a manner similar to that of the semiconductor memory device 200 in FIG. 5.

The semiconductor memory device 300 in FIG. 6 can provide a faster reading by the sense circuit 20 because it is possible to make the potential difference large between the ON state and the OFF state of the memory cell transistors of the bit lines 11. Japanese Laid-open Publication No. 3-30193 discloses a similar semiconductor memory device which is capable of a fast reading.

A reference voltage generating circuit 30' shown in FIG. 7 employs a NOR circuit NOR1 instead of the inverter INV1 of the reference voltage generating circuit 30 of the semiconductor memory device 300 in FIG. 6. One of the two inputs of the NOR circuit NOR1 has a feed back structure similar to that of the inverter INV1 in FIGS. 5 and 6. A switching signal CEB for switching between the stand-by (wait) state and the operation state is applied to the other input of the NOR circuit NOR1.

In this case, when the switching signal CEB is in the L level, the NOR circuit NOR1 functions similar to the inverter INV1 in FIGS. 5 and 6 so as to generate a charge voltage (i.e., the precharge voltage). When the switching signal CEB is in the H level, the NOR circuit NOR1 outputs the L level, causing the reference voltage generating circuit 30' to be in the stand-by state. Thus, there is no possibility that the voltage of the bit line 11 may increase.

According to the semiconductor memory devices 200 and 300 in FIGS. 5 and 6, and the reference voltage genera ting circuit 30' in FIGS. 7, a through current flows in the inverter INV1 (FIGS. 5 and 6 ) or the NOR circuit NOR1 (FIG. 7), even if inverter INV1 or the NOR circuit NOR1 is in the CMOS configuration. This is because a predetermined reference voltage is applied to the inverter INV1 or the NOR circuit NOR1 while the inverter INV1 or the NOR circuit NOR1 generates the reference voltage. Therefore, in the case of a high performance MROM where a lot of information is simultaneously read from the memory cells, a plurality of such precharge circuits are required. In such a case, the through current flows in each of the plurality of precharge circuits. This requires a large operation current for the semiconductor memory device.

In order to reduce the operation current in a high performance MROM requiring a plurality of precharge circuits, a reference voltage generating circuit 30" as shown in FIG. 8 has been proposed, in which a serial circuit including resistors R1 and R2 is used. The output potential of the reference voltage generating circuit 30" is the same as the potential at the contact point between the resistors R1 and R2. In order to further reduce the operation current of the semiconductor memory device, a similar resistor may be connected to the gate of the Nch charge transistor N1 (FIG. 5), or the gates of the Nch charge transistor N1 and the Nch charge transistor N2 (FIG. 6). Furthermore, one or a few similar resistors may be connected to each of the charge transistors.

According to the device in FIG. 8, by increasing the resistance value of the serial circuit including the resistors R1 and R2, the through current flowing between the supply voltage VCC and GND can be reduced. Furthermore, by connecting one or a few similar resistors to each of the charge transistors, the operation current of the charge transistors as a whole can be reduced.

According to the device in FIG. 8, however, reducing the through current or providing a few resistor-separation circuits extends the time required for charging the gate of the Nch charge transistor N1. Specifically, by reducing the through current, the charge current is also reduced and therefore the time required for charging the gate of the Nch charge transistor N1 is extended. As a result, in the case of an MROM having a stand-by function, the access to the memory cells slows down after the memory device is released from the stand-by state. This may cause the problem that a significant reduction of the through current during the stand-by state is impossible. Therefore, even when the memory device is in the stand-by state, a stand-by current corresponding to the quantity of the through current is present. Accordingly, either in the precharge circuit employing a feedback device or in the precharge circuit employing resistor separation, it is difficult to reduce the stand-by current simultaneously with a reduction of the operation current.

SUMMARY OF THE INVENTION

According to one aspect of this invention, there is provided a semiconductor memory device, including: a bit line; a reference voltage generating circuit; a first transistor whose drain or source region is connected to the bit line, a voltage generated in the reference voltage generating circuit being applied to a gate region of the first transistor; and a memory cell connected to the first transistor at least via the bit line, wherein the reference voltage generating circuit includes: a second transistor connected to the first transistor in a source-follower connection; and at least one first element having an electrical resistance for controlling a current flowing the second transistor.

In one embodiment of the invention, the semiconductor memory device further includes: a third transistor whose gate region is connected to the gate region of the fist transistor; a fourth transistor having a source region and a drain region, in which one of the source region or the drain region is connected to either the drain region or the source region of the third transistor, the other of the drain region or the source region of the fourth transistor being connected to the bit line.

In another embodiment of the invention, an ON resistance of the third transistor is lower than an ON resistance of the first transistor.

In still another embodiment of the invention, the second transistor is an Nch transistor.

In still another embodiment of the invention, the at least one first element is a transistor.

In still another embodiment of the invention, the at least one first element is a resistor.

In still another embodiment of the invention, the reference voltage generating circuit further includes: a inversion voltage generating circuit connected to the gate region of the second transistor; and a fifth transistor whose gate region is supplied with an output of the inversion voltage generating circuit, either of the drain and source region of the fifth transistor being connected to the gate region of the first transistor, and the other of the drain and source region being grounded.

Thus, the invention described herein makes possible the advantages of providing a semiconductor memory device having a precharge circuit which is capable of reducing the operation current and the stand-by current at the same time.

These and other advantages of the present invention will become apparent to those skilled in the art upon reading and understanding the following detailed description with reference to the accompanying figures.

DESCRIPTION OF THE PREFERRED EMBODIMENTS

Figure 1:
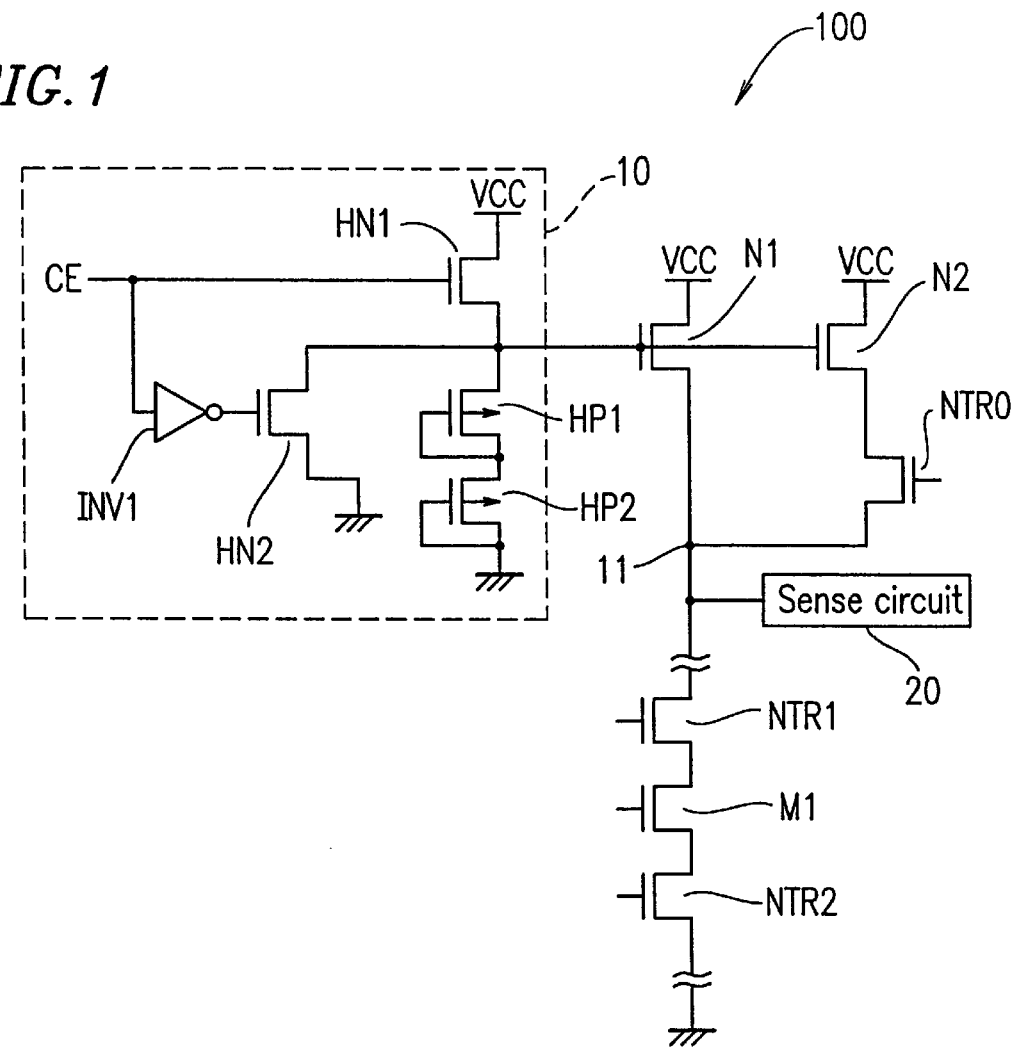
FIG. 1 is a circuit diagram illustrating an example of a semiconductor memory device according to the present invention.

With reference to the attached drawings, preferred embodiments of the present invention will now be described in detail. FIG. 1 is a circuit diagram showing an example of the semiconductor memory device according to the present invention. A semiconductor memory device 100 includes a reference voltage generating circuit 10 having a high performance (i.e., low ON resistance) Nch transistor HN1 which is connected in a source-follower connection, a low performance (i.e., high ON resistance) Nch charge transistor N1, and a high performance (i.e., low ON resistance) Nch charge transistor N2. The Nch charge transistor N1 is supplied with the output of the reference voltage generating circuit 10. The gate of the Nch transistor HN1 is supplied with a switching signal CE which switches between the stand-by state and the operation state. The drain of the Nch transistor HN1 is connected to a supply voltage VCC.

The source of the Nch transistor HN1 is connected to the source of a low performance (high ON resistance) Pch (P-channel) transistor HP1, and the drain of the Pch transistor HP1 is connected to the source of a low performance Pch transistor HP2. The contact point between the source of the Nch transistor HN1 and the source of the Pch transistor HP1 is connected to the gates of the Nch charge transistors N1 and N2. The connection manner described above, in which the source of the Nch transistor HN1 is connected to the gate of the Nch charge transistor N1 (and to the gate of the Nch charge transistor N2), is called a source-follower connection. According to the source-follower connection shown in FIG. 1, when the switching signal CE is applied to the gate of the Nch transistor HN1, a signal is output from the source of the Nch transistor HN1 to the gates of the Nch charge transistors N1 and N2 in the same phase as that of the switching signal CE as if the signal follows the switching signal CE.

The drain and the gate of the Pch transistor HP1 are connected to each other. The drain of the Pch transistor HP2 is connected to GND, and the drain and the gate of the Pch transistor HP2 are connected to each other.

The switching signal CE applied to the gate of the Nch transistor HN1 is also applied to the inverter INV1, and the output of the inverter INV1 is applied to the gate of the Nch transistor HN2. The drain of the Nch transistor HN2 is connected to the source of the Pch transistor HP1, the gate of the Nch charge transistor N1, and the gate of the Nch charge transistor N2. The gates of the Nch charge transistors N1 and N2 are in the L level during the stand-by state. The source of the Nch transistor HN2 is connected to GND.

The drain of the Nch charge transistor N1 is connected to the supply voltage VCC. The bit line 11 connects the source of the Nch charge transistor N1 and the drain of an Nch transistor NTR1, and a sense circuit 20 is connected therebetween. The source of the Nch transistor NTR1 is connected to the drain of the memory cell transistor M1. The drain of an Nch transistor NTR2 is connected to the source of the memory cell transistor M1. The source of the Nch transistor NTR2 is connected to GND.

The gate of the charge transistor N1 is connected to the gate of the Nch charge transistor N2, and the source of the Nch charge transistor N2 is connected to the drain of the Nch transistor NTR0. The drain of the Nch charge transistor N2 is connected to the supply voltage VCC.

The ON-OFF control of the Nch transistor NTR0 may be performed by signals generated in an ATD circuit (address transition detection circuit) and the like. The source of the Nch transistor NTR0 is connected to the bit line 11.

According to the semiconductor memory device 100 having such a configuration, the Nch transistor HN1 in the reference voltage generating circuit 10 is connected in a source-follower connection. Therefore, when the CE signal is in the L level (i.e., in the stand-by state), the Nch transistor HN1, the Nch charge transistor N1, and the Nch charge transistor N2 are all turned OFF, whereby no through current flows in the reference voltage generating circuit 10 and therefore the stand-by current of the entire semiconductor memory device is reduced.

On the other hand, when the CE signal turns from the L level to the H level (i.e., turns from the stand-by state to the read state), the through current of the reference voltage generating circuit 10 flows only as a minute current from the Nch transistor HN1 via the Pch transistors HP1 and HP2, and the current for charging the bit line 11 flows to the Nch charge transistor N1 at a high speed, whereby the bit line 11 is quickly charged. In addition, since the Nch transistor HN1 is an N-type transistor, there is no possibility for the charge potential of the bit line 11 to reach the level of the supply voltage VCC. Therefore, the charge potential of the bit line 11 does not unnecessarily increase.

Furthermore, according to the semiconductor memory device 100, high ON resistance Pch transistors HP1 and HP2 are serially connected between the gate of the charge transistor N1 and GND. The gate and drain of each of the Pch transistors HP1 and HP2 are connected to each other. Therefore, the resistance between the gate of the Nch charge transistor N1 and GND is high and no large current constantly flows into the bit line 11.

If the voltage at the gate of the Nch charge transistor N1 increases over a desired voltage for some reason, the current flows to GND through the pair of Pch transistors HP1 and HP2. Therefore, the voltage of the charge transistor N1 is lowered.

Although in the above example, a pair of Pch transistors HP1 and HP2 are connected between the source of the source-follower connected Nch transistor HN1 and GND, three or more low performance Pch transistors may be alternatively connected therebetween.

Furthermore, according to the semiconductor memory device 100 of the present example, an Nch charge transistor N2 has a high driving performance assisting the charging of the bit line 11, and an Nch transistor NTR0 which turns ON during the precharge period is provided between the source of the Nch charge transistor N2 and the bit line 11. Therefore, the current driving performance of the Nch charge transistor N1 can be made low even if the current driving performance of the memory cell transistor M1 is low, whereby the potential difference is made large between the bit line 11 connected to an ON transistor and the bit line 11 connected to an OFF transistor. As a result, it is possible for the sense circuit 20 to quickly read the potential of the bit line 11 so as to determine the ON/OFF state of the memory cell transistor M1.

Generally, when the temperature decreases, the resistance decreases. This causes the source/drain current within a transistor to increase, and thus the operation current to increase. According to the semiconductor memory device 100 of the present invention, however, the voltage is generated based on the threshold value of the Nch transistor HN1. Therefore, when the temperature decreases, the threshold value of the Nch transistor HN1 becomes higher, and the charge level of the bit line 11 becomes lower. Under a low temperature, the line resistance also decreases, and therefore the information stored in the memory cell can be read even if the charge level of the bit line 11 is low. In addition, by lowering the charge level, the operation current is also reduced.

Figure 2:
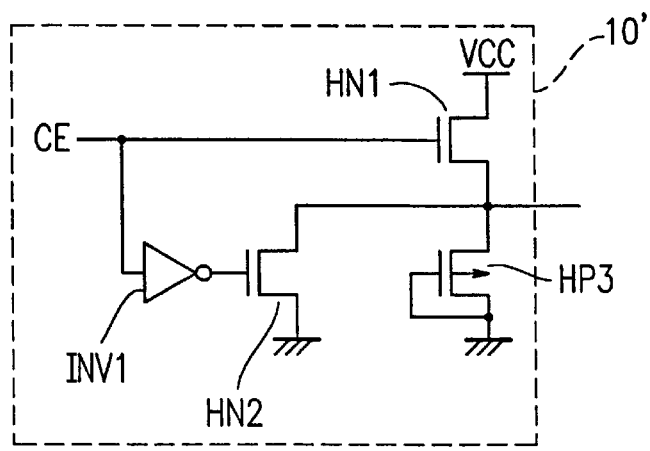
FIG. 2 is a partial circuit diagram illustrating another example of a semiconductor memory device according to the present invention.

FIG. 2 shows a charge voltage generating circuit 10' in another example of a semiconductor memory device 100 according to the present invention. The charge voltage generating circuit 10' in FIG. 2 is similar to the charge voltage generating circuit 10 in FIG. 1 except that the charge voltage generating circuit 10' in FIG. 2 includes a low performance (high ON resistance) Pch transistor HP3 instead of the pair of Pch transistors HP1 and HP2 of the charge voltage generating circuit 10 in FIG. 1. According to the charge voltage generating circuit 10' in FIG. 2, the quantity of the flowing current is only that corresponding to the performance of the Pch transistor HP3, and therefore the operation current is reduced. This is because the performance of the Pch transistor HP3 is low.

Figure 3:
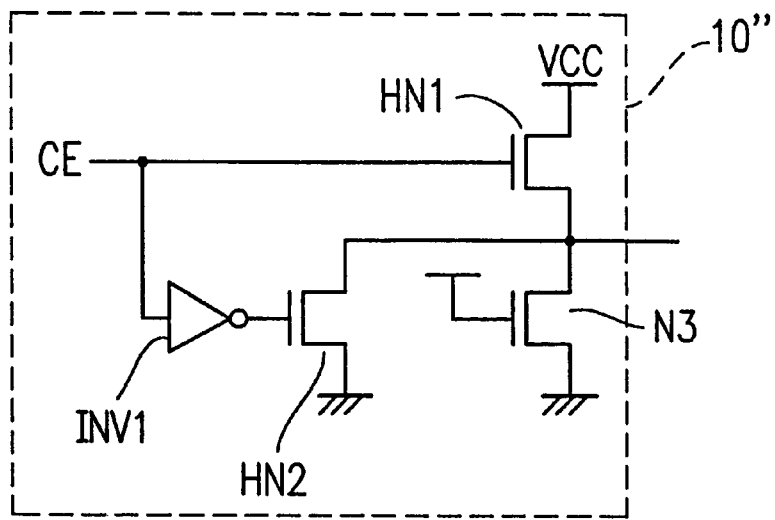
FIG. 3 is a partial circuit diagram illustrating still another example of a semiconductor memory device according to the present invention.

FIG. 3 shows a charge voltage generating circuit 10'' in still another example of a semiconductor memory device 100 according to the present invention. The charge voltage generating circuit 10'' in FIG. 3 is similar to the charge voltage generating circuit 10' in FIG. 2 except that the charge voltage generating circuit 10'' in FIG. 3 includes an Nch transistor N3 instead of the Pch transistor HP3 of the charge voltage generating circuit 10' in FIG. 2. According to the charge voltage generating circuit 10'' in FIG. 3, a current flowing in the device is larger than that in the charge voltage generating circuit 10' in FIG. 2. but as compared to a conventional semiconductor memory device, both the operation current and the stand-by current are reduced.

Figure 4:
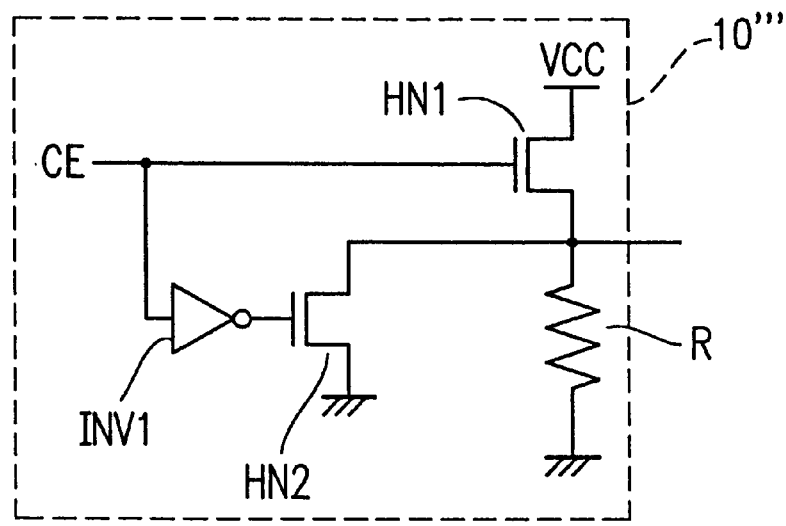
FIG. 4 is a partial circuit diagram illustrating still another example of a semiconductor memory device according to the present invention.
Figure 5:
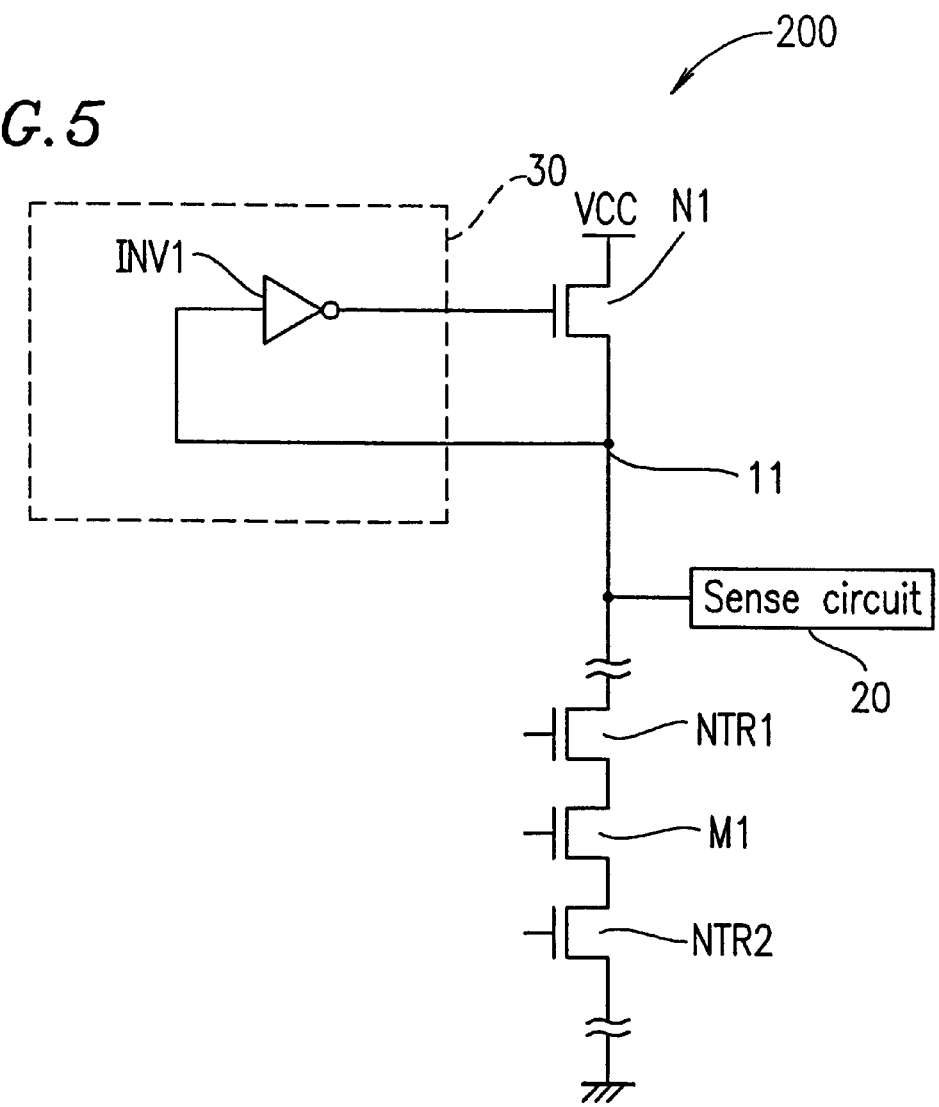
FIG. 5 is a circuit diagram illustrating an example of a conventional semiconductor memory device.
Figure 6:
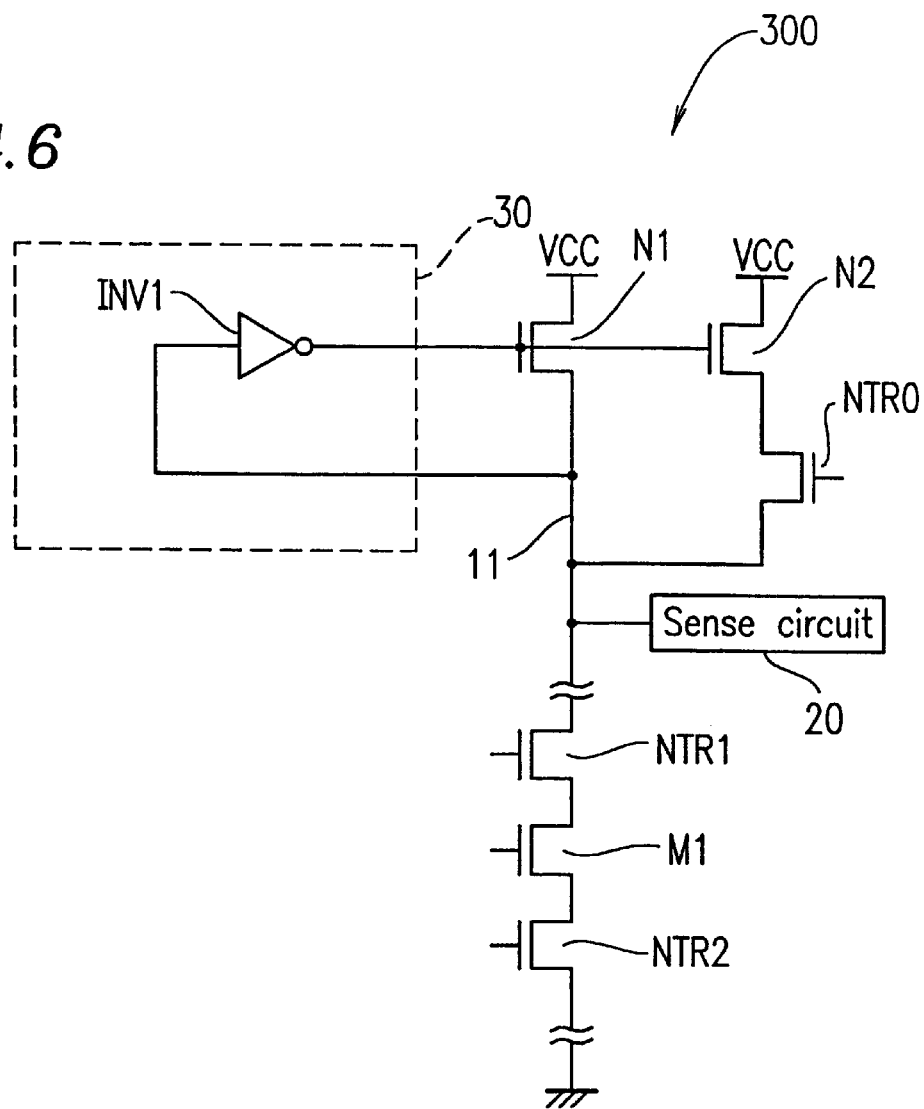
FIG. 6 is a partial circuit diagram illustrating another example of a conventional semiconductor memory device.
Figure 7:
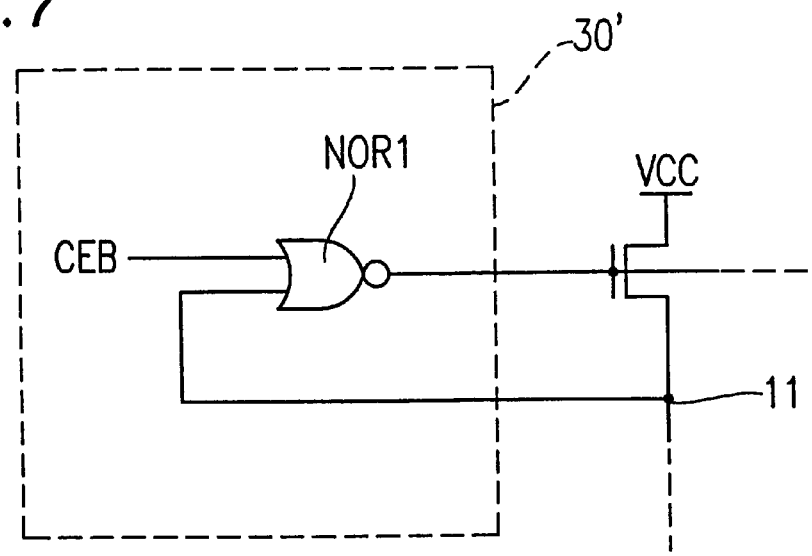
FIG. 7 is a partial circuit diagram illustrating still another example of a conventional semiconductor memory device.
Figure 8:
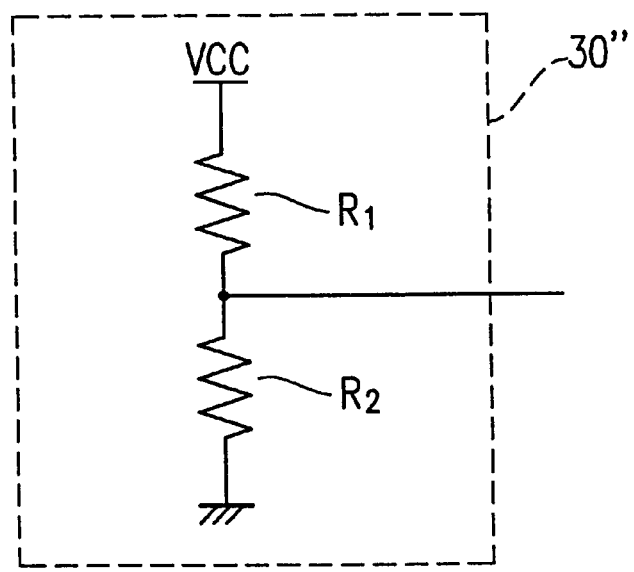
FIG. 8 is a partial circuit diagram illustrating still another example of a conventional semiconductor memory device.

The charge voltage generating circuit 10''' in FIG. 4 includes a resistor R instead of the Nch transistor N3 of the charge voltage generating circuit 10'' in FIG. 3. This configuration also reduces both the operation current and the stand-by current as compared to a conventional semiconductor memory device.

In the above examples, only one pair of Pch transistors HP1 and HP2 (FIG. 1), one Pch transistor HP3 (FIG. 2), one Nch transistor N3 (FIG. 3), and one resistor R (FIG. 4) are provided on the chip. Alternatively, a plurality of such elements (or pairs of elements) can be provided on the chip. Furthermore, the transistor used in the present invention is not limited to the Nch transistor. Other appropriate elements such as Pch transistors and bipolar transistors can also be used.

As described above, according to the semiconductor memory device of the present invention, the chip area does not increase even though the semiconductor memory device is so configured as to precharge the bit line by the precharge circuit. In addition, even in a high performance device with a multiple bit capability, the operation current can be reduced. If the semiconductor memory device incorporates a stand-by function, the stand-by current can be reduced. Furthermore, the effect of reducing the temperature dependence of the operation current is also achieved.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a bit line;
   a reference voltage generating circuit;
   a first transistor whose drain or source region is connected to the bit line, a voltage generated in the reference voltage generating circuit being applied to a gate region of the first transistor; and
   a memory cell connected to the first transistor at least via the bit line, wherein the reference voltage generating circuit includes:
      a second transistor connected to the first transistor in a source-follower connection; and
      at least one first element having an electrical resistance for controlling a current flowing the second transistor.

2. A semiconductor memory device according to claim 1, further comprising:
   a third transistor whose gate region is connected to the gate region of the first transistor;
   a fourth transistor having a source region and a drain region, in which one of the source region or the drain region is connected to either the drain region or the source region of the third transistor, the other of the drain region or the source region of the fourth transistor being connected to the bit line.

3. A semiconductor memory device according to claim 2, wherein an ON resistance of the third transistor is lower than an ON resistance of the first transistor.

4. A semiconductor memory device according to claim 1, wherein the second transistor is an Nch transistor.

5. A semiconductor memory device according to claim 1, wherein the at least one first element is a transistor.

6. A semiconductor memory device according to claim 1, wherein the at least one first element is a resistor.

7. A semiconductor memory device according to claim 1, wherein the reference voltage generating circuit further comprises:

a inversion voltage generating circuit connected to the gate region of the second transistor; and a fifth transistor whose gate region is supplied with an output of the invention voltage generating circuit, either of the drain and source region of the fifth transistor being connected to the gate region of the first transistor, and the other of the drain and source region being grounded.

* * * * *